United States Patent [19]

Kay

[11] 3,889,137

[45] June 10, 1975

[54] CIRCUIT ARRANGEMENTS COMPRISING A SWITCHING TRANSISTOR

[75] Inventor: Malcolm John Kay, Lockleys, Australia

[73] Assignee: U.S. Philips Corporation, New York, N.Y.

[22] Filed: Dec. 10, 1973

[21] Appl. No.: 423,275

[30] Foreign Application Priority Data

Dec. 20, 1974 Australia .......................... 59174/73

[52] U.S. Cl. ................. 307/300; 307/254; 307/310

[51] Int. Cl. ........................................... H03k 17/00

[58] Field of Search ........... 307/310, 300, 315, 254, 307/296

[56] References Cited

UNITED STATES PATENTS 3,283,244 11/1966 Proctor et al. ...................... 307/315

3,678,291 7/1972 Coe .................................... 307/315

OTHER PUBLICATIONS

IBM Tech. Disclosure Bulletin by May, Jr., Vol. 10, No. 7, 12/67, page 1,045.

*Primary Examiner*—Michael J. Lynch
*Assistant Examiner*—B. P. Davis
*Attorney, Agent, or Firm*—Frank R. Trifari

[57] ABSTRACT

An arrangement for driving a switching transistor in which a current sensing resistor is connected between an input amplifier and the switching transistor. A feedback loop is created by a transistor having its base-emitter junction coupled to the current sensing resistor and its collector supplying the feedback signal to the amplifier input. The arrangement insures saturated switching of the switching transistor over a range of operating conditions.

7 Claims, 2 Drawing Figures

CIRCUIT ARRANGEMENTS COMPRISING A SWITCHING TRANSISTOR

The present invention relates to circuit arrangements of the kind comprising a switching transistor to the base of which a switching signal is supplied from a switching signal source for rendering the switching transistor conductive.

In designing such a circuit arrangement, allowance must be made to ensure that sufficient base current drive is available to completely switch the switching transistor under the required operating conditions of the circuit arrangement i.e. over the complete operating temperature range of the circuit arrangement and over the complete range of variation anticipated in the magnitude of the supply voltage and that of the switching signal. In most cases complete switching requires the switching transistor to be driven into saturation.

With known circuit arrangements, there is the problem that these design requirements dictate a higher than necessary base current at nominal operating temperature with nominal magnitudes for the supply voltage and the switching signal resulting in an unnecessarily high power dissipation in the base drive. Furthermore, it should be noted that an increase in temperature usually results in a decreased base current drive requirement for the switching transistor. In other words, with an increase of temperature the base-emitter voltage of the switching transistor in the operating state is reduced. Accordingly, with the known circuit arrangements, an increase in temperature results in an increase of the base drive current whereas the current gain of the switching transistor will, in general, increase so that less base drive current is actually required.

If the base current drive circuit incorporated a driving transistor connected in emitter-follower configuration, then this problem is accentuated.

In a circuit arrangement in accordance with the invention, the switching signal for the switching transistor is supplied from the switching signal source via an amplifier having a current sensing impedance connected between the amplifier output and the base of the switching transistor, the amplifier being included within a negative feedback loop in which a feedback signal is derived from the collector of a feedback signal supplying transistor, the base-emitter junction of which is so connected across the current sensing impedance that base current to the switching transistor forward biases the base-emitter junction of the feedback signal supplying transistor.

The current elements of a circuit arrangement in accordance with the invention should be so proportioned that over the anticipated range of operating conditions, the magnitude of the base current supplied to the switching transistor in response to the switching signal is equal to or in excess of that required for saturation.

The addition the said circuit element should be so proportioned that, over a significant portion of the said anticipated range, the base current drive in excess of that required for saturation is substantially less than the excess which would occur if the feedback loop were open-circuited at the collector of the said feedback signal supplying transistor.

Preferably, sufficient gain should be provided within the feedback loop that the feedback current from the collector of the feedback signal supplying transistor is small with respect to the current flowing through the current sensing impedance.

In one version of the invention, the said amplifier is in the form of a driving transistor connected in emitter-follower configuration, with the feedback signal derived from the collector of the feedback signal supplying transistor being applied to the base of the driving transistor. In this version, the switching signal from the switching signal source is also applied to the base of the driving transistor via a series impedance. However, such a series impedance may be omitted if the impedance of the switching signal source is sufficient to achieve the required loop gain.

The invention will now be described with reference to the attached drawings in which in each case the switching transistor is required to be driven to saturation in the conductive state and in which.

Figure 1:
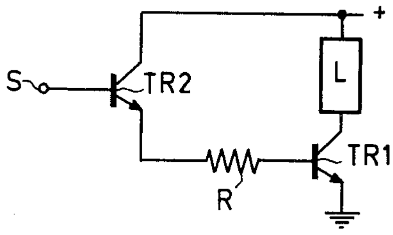
FIG. 1 is a circuit diagram of a known circuit arrangement of the kind to which the invention relates.

In FIG. 1, a load L is included in the collector circuit of a switching transistor TR1 which is rendered conductive by a switching signal supplied from a signal source (not shown) via the terminal S, the current amplifying transistor TR2 and the current limiting resistance R to the base of the transistor TR1.

For a switching signal of given magnitude, the magnitude of the base current for the transistor TR1 is chiefly determined by the value of the limiting resistance R which should be chosen to minimise power dissipation in the circuit and at the same time provide sufficient base drive to saturate the transistor TR1 at all operating temperatures and over the anticipated range of switching signal magnitudes and supply voltage variations.

Assuming a supply voltage of 6 volts, a signal source amplitude of 5 volts and base-emitter voltages in the conductive state of the transistors TR1 and TR2 of 0.7 volts at a nominal temperature, and with a value for the resistance R of 500 ohms, so chosen with respect to the characteristics of the transistors TR1 and TR2 that sufficient base current drive is produced for the transistor TR1 to be saturated and at the same time the base current is not large enough to result in excessive dissipation of power in the base drive circuitry. With these values, the resultant base current of the transistor TR1 can be calculated as being 7.2 milliamps.

If we now consider a temperature of 50°C below the nominal temperature and assume a temperature coefficient of −2 milli volts per 1°C in the base-emitter voltages of the transistors TR1 and TR2, then the base-emitter voltages of the transistors TR1 and TR2 will increase from their nominal 0.7 up to 0.8 volts. This results in a reduction of the base drive current from 7.2 to 6.8 milliamps. Such a drop, in itself would not normally be of significance but it is exaggerated by the increased drive requirement of the transistor TR1 at the lower temperature due to reduced low temperature current gain in this transistor.

If the design procedure has ensured that saturation of the transistor TR1 occurs under the circumstances outlined, then it is evident that at the nominal temperature and at higher temperatures than the nominal temperature, the base current of the transistor TR1 will be in excess of that required for saturation and hence there is excessive power dissipation at high temperatures where this excessive dissipation is most troublesome, particularly if the circuit arrangement under discussion forms part of an integrated circuit assembly.

Similarly, it will be evident to persons skilled in the art that allowance in the design for extremes of signal source magnitude and supply voltage magnitude will cause further excesses in dissipation at nominal and higher than nominal supply voltage and signal source magnitudes.

Figure 2:
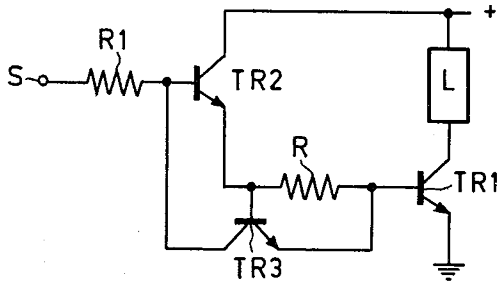
FIG. 2 is a circuit diagram of a circuit arrangement in accordance with the present invention.

The drawbacks of the circuit arrangement of FIG. 1 are reduced in the circuit arrangement of FIG. 2.

In FIG. 2, like parts are denoted by like numerals or letters. The chief difference between the circuit arrangement of FIG. 1 and that of FIG. 2 is that the resistance R now serves as a current sensor rather than a current limiter. In addition, a feedback signal supply transistor TR3 monitors the voltage drop across the resistance R and applies feedback via its collector to the base of the amplifying transistor TR3. The resistance R1 serves both as a load for the transistor TR3 and also to couple the terminal S to the base of the transistor TR2.

Assuming again, a supply voltage of 6 volts, a signal source amplitude of five bolts and base-emitter voltages of the transistors TR1, TR2 and TR3, in the conductive state, of 0.7 volts at a nominal temperature and with a value for the trsistance R of 120 ohms so chosen with respect to the characteristic of the transistors TR1, TR2 and TR3 that sufficient base drive current is produced for the transistor TR1 to be saturated and at the same time the base current is not large enough to result in excessive dissipation of power in the base circuitry. Assuming also that the transistors TR1 and TR2 each have a current gain of 50 and assuming the resistance R1 has a value of 10,000 ohms, then, at 50°C below the nominal temperature there is a base drive current for the transistor TR1 of 6.8 milliamps as the case of the circuit of FIG. 1. However, when the temperature is at the nominal value, this base drive current is reduced to 6.0 milliamps which, in view of the higher current gain of the transistor TR1 at nominal temperature as compared to that at the low temperature (50°C below the nominal temperature) will still be sufficnet to ensure saturation of the transistor TR1 but with a dissipation only 80 percent of that occurring at the nominal temperature of the circuit arrangement of FIG. 1. Still greater economies of power dissipation will occur at temperatures greater than the nominal temperature.

The reduction of base drive current as the temperature increases is brought about by the reduction in the base-emitter junction voltage of the transistor TR3 to which the voltage drop across the resistance R is matched by the feedback arrangement. Of course, a reduction in the voltage drop across the resistance R due to increased temperature implies a reduction of current applied to the base of the transistor TR1 via this resistance. Any current reaching the base of the transistor TR1 via the emitter of the transistor TR3 is small compared with the current reaching the base of the transistor TR1 via the resistance R and consequently the variation in this part of the base drive circuitry is not significant.

Since the primary source of base drive current to the transistor TR1 is via the resistance R, and the voltage drop across this resistance is matched to the base-emitter voltage of the transistor TR3, it is apparent that the current applied to the base of the transistor TR1 is largely independent of supply voltage variations or variations in the signal source magnitude although some residual influence will be produced by the small current reaching the base of the transistor TR1 via the emitter of the transistor TR3.

Many variations of the embodiment described in relation to FIG. 2 and alternative embodiments of the invention than that described in relation to FIG. 2 will be evident to persons skilled in the art. For instance, in one variation, additional circuitry, such as a bleeder resistance, is connected to the base electrode of the switching transistor to accommodate reverse base currents whilst switching from the conductive to the non-conductive state. It follows that in proportioning a circuit arrangement in accordance with the invention, account must be taken of the current consumed by such additional circuitry. In another variation, the current sensing impedance is in a form other than a resistance. Such variations and alternatives are intended to be included within the scope of the present invention.

What is claimed is:

1. A switching circuit arrangement comprising:
   a switching transistor;
   means for supplying a switching signal for rendering said switching transistor conductive;
   an amplifier for supplying said switching signal to said switching transistor, said amplifier having a current sensing impedence connected between the amplifier output and the base of the switching transistor; and
   a feedback transistor for supplying a negative feedback signal to the input of the amplifier, said feedback transistor having its base-emitter junction connected across the current sensing impedance and having its collector supplying said feedback signal to the amplifier input, the base current being supplied to the switching transistor also operating to forward bias the base-emitter junction of the feedback transistor.

2. A circuit arrangement as claimed in claim 1 in which the circuit elements of the arrangement are preselected so that over the anticipated range of operating conditions, the magnitude of the base current supplied to the switching transistor in response to the switching signal is at least equal to that required for saturation.

3. A circuit arrangement as claimed in claim 2 in which the said circuit elements are preselected so that, over a significant portion of said anticipated range, the base current drive in excess of that required.

4. A circuit arrangement as claimed in claim 1 in which said feedback transistor creates a negative feedback loop, the gain within the feedback loop being such that the feedback current from the collector of said feedback signal supplying transistor is small compared to the current flowing through said current sensing impedance.

5. A circuit arrangement as claimed in claim 1 in which the said amplifier is in the form of a driving transistor connected in emitter-follower configuration, said feedback signal derived from the collector of said feedback signal supplying transistor being applied to the base of the driving transistor.

6. A circuit arrangement as claimed in claim 5 in which the switching signal from the said switching signal source is supplied to base of the said driving transistor via a series impedance.

7. A circuit arrangement as claimed in claim 1 in which the said current sensing impedance is in the form of a resistance.

* * * * *

UNITED STATES PATENT AND TRADEMARK OFFICE

CERTIFICATE OF CORRECTION

PATENT NO. : 3,889,137

DATED : June 10, 1975

INVENTOR(S) : MALCOM JOHN KAY

It is certified that error appears in the above-identified patent and that said Letters Patent are hereby corrected as shown below:

Claim 3, line 4, after "required" insert --for saturation is substantially less than the excess which would occur if the feedback loop were open-circuited at the collector of the said feedback signal supplying transistor--.

Signed and Sealed this

*twenty-third* Day of *December 1975*

[SEAL]

*Attest:*

RUTH C. MASON
*Attesting Officer*

C. MARSHALL DANN
*Commissioner of Patents and Trademarks*

UNITED STATES PATENT AND TRADEMARK OFFICE
CERTIFICATE OF CORRECTION

PATENT NO. : 3,889,137
DATED : June 10, 1975
INVENTOR(S) : MALCOM JOHN KAY

It is certified that error appears in the above-identified patent and that said Letters Patent are hereby corrected as shown below:

On the title page, section [30], should read as follows: Foreign Application Priority Data December 20, 1972 Australia..........PB 1690-72

Column 1, line 52, change "current" to --circuit--.

Column 2, line 54, after "0.7" insert --volts--
line 56, after "itself" insert --,--.

Column 3, line 24, change "bolts" to --volts--.

Claim 1, line 7, change "impedence" to --impedance--.

Signed and Sealed this

*twenty-ninth* Day of *June 1976*

[SEAL]

*Attest:*

RUTH C. MASON
*Attesting Officer*

C. MARSHALL DANN
*Commissioner of Patents and Trademarks*